US009105519B2

(12) United States Patent
Kaneda

(10) Patent No.: US 9,105,519 B2
(45) Date of Patent: Aug. 11, 2015

(54) SUBSTRATE TREATMENT APPARATUS, SUBSTRATE TREATMENT METHOD, AND NON-TRANSITORY STORAGE MEDIUM

(71) Applicant: Tokyo Electron Limited, Tokyo (JP)

(72) Inventor: Masatoshi Kaneda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/518,244

(22) Filed: Oct. 20, 2014

(65) Prior Publication Data

US 2015/0037911 A1 Feb. 5, 2015

Related U.S. Application Data

(62) Division of application No. 13/741,554, filed on Jan. 15, 2013, now Pat. No. 8,893,650.

(30) Foreign Application Priority Data

Feb. 7, 2012 (JP) .................. 2012-024422
Nov. 13, 2012 (JP) .................. 2012-249521

(51) Int. Cl.
*H01L 21/66* (2006.01)
*H01L 21/02* (2006.01)
*H01L 21/67* (2006.01)
*H01L 21/324* (2006.01)

(52) U.S. Cl.
CPC .......... *H01L 22/12* (2013.01); *H01L 21/02104* (2013.01); *H01L 21/324* (2013.01); *H01L 21/67115* (2013.01); *H01L 21/67178* (2013.01); *H01L 21/67276* (2013.01); *H01L 21/67288* (2013.01); *H01L 22/10* (2013.01)

(58) Field of Classification Search
USPC ......................................................... 118/712
See application file for complete search history.

(56) References Cited

U.S. PATENT DOCUMENTS

2005/0055175 A1 3/2005 Jahns et al.
2006/0016458 A1 1/2006 Novak et al.

FOREIGN PATENT DOCUMENTS

JP 2008-277528 A 11/2008
JP 2009-278138 A 11/2009

*Primary Examiner* — Alexander Ghyka
*Assistant Examiner* — Stanetta Isaac
(74) *Attorney, Agent, or Firm* — Posz Law Group, PLC

(57) ABSTRACT

A substrate treatment apparatus configured such that substrates in a same lot are distributed by a delivery mechanism into a plurality of unit blocks, each unit block including a solution treatment module, an ultraviolet irradiation module, and a substrate carrying mechanism, the apparatus includes: an illuminance detection part that detects an illuminance of a light source of the ultraviolet irradiation module; and a control part that controls, when an illuminance detection value of the ultraviolet irradiation module in one unit block among the plurality of unit blocks becomes a set value or less, the delivery mechanism to stop delivery of a substrate to the one unit block and deliver subsequent substrates to another unit block, and the ultraviolet irradiation module to perform irradiation on substrates which have already been delivered to the one unit block with an irradiation time adjusted to a length according to the illuminance detection value.

20 Claims, 12 Drawing Sheets

SUBSTRATE TREATMENT APPARATUS, SUBSTRATE TREATMENT METHOD, AND NON-TRANSITORY STORAGE MEDIUM

CROSS REFERENCE TO RELATED APPLICATION

The present application is a divisional application of U.S. utility application Ser. No. 13/741,554 filed on Jan. 15, 2013, which is related to, claims priority from and incorporates by reference Japanese Patent Applications No. 2012-024422, filed on Feb. 7, 2012 and No. 2012-249521 filed on Nov. 13, 2012.

BACKGROUND OF THE INVENTION

1. Field of the Invention

The present invention relates to a technical field of a substrate treatment apparatus and a substrate treatment method using a module performing a solution treatment and a module performing ultraviolet irradiation on a substrate.

2. Description of the Related Art

In a photoresist step that is one of semiconductor manufacturing steps, resist is supplied to the front surface of a semiconductor wafer (hereinafter, referred to as a wafer) and exposed into a predetermined pattern and then developed to form a resist pattern. The formation of the resist pattern is performed by a system in which an exposure apparatus performing exposure processing is connected a coating and developing apparatus performing a forming treatment and a developing treatment of various kinds of coating films such of resist and the like.

As one module provided in the coating and developing apparatus, there is an edge exposure module that exposes an edge portion of the wafer after the resist film is formed thereon so as to prevent the resist film at the edge portion outside a pattern region of the wafer from remaining. This module is to irradiate the edge portion of the wafer with an ultraviolet ray using, for example, a mercury lamp, a xenon lamp or the like. Because of an operating life of the lamp, time to change the lamp is decided so that an alarm is outputted when the change time comes and the lamp is changed.

On the other hand, it is studied that a unit block including the edge exposure module and the like is made duplex to be able to continue treatments on wafers even when maintenance such as the change of lamp is being performed (Japanese Laid-open Patent Publication No. 2008-277528). In this case, the wafers are distributed and carried to both unit blocks, and when maintenance is performed on one unit block, or when a trouble has occurred in one unit block, the other unit block can be used as described in Japanese Laid-open Patent Publication No. 2009-278138.

Incidentally, after a lapse of the operating life of the lamp, the lamp cannot be used at all any longer, so that the wafers for which the treatments for forming a coating film before exposure cannot be passed to the downstream side and those remaining wafers should be collected, resulting in a reduced operating efficiency of the apparatus. On the other hand, because of variations in operating life of individual lamps, the time to change the lamp is set to the time earlier than the actual end of the operating life in consideration of a margin. Therefore, the running cost of the edge exposure module becomes high and the maintenance frequency is also high. It is also known that when the illuminance of the lamp has decreased, the edge exposure is performed with an exposure time increased according to the amount of decrease (integrated exposure), but when the lamp reaches the end of the operating life and its illuminance is below the lower limit, the wafers for which the above treatments are being performed cannot be passed any longer and the integrated exposure is a cause of decreasing the throughput because of long processing time.

Further, the processing of irradiating the substrate such as a wafer or the like with an ultraviolet ray includes processing of removing an organic substance and processing of improving the quality of an insulating film such as a silicon oxide film other than the edge exposure. The ultraviolet irradiation module performing such processing is sometimes arranged in a block including a carry path together with, for example, a module performing single wafer cleaning and a chemical coating module for a silicon oxide film. This case also has the same problems as those in the above.

SUMMARY OF THE INVENTION

The present invention has been made under such circumstances, and its object is to provide a technique capable of increasing a change cycle of a light source of an ultraviolet irradiation module and suppressing a decreased in throughput when irradiating a substrate with an ultraviolet ray to perform processing on the substrate.

A substrate treatment apparatus according to the present invention is a substrate treatment apparatus configured such that substrates in a same lot taken out of a carrier are distributed by a delivery mechanism into a plurality of unit blocks for performing a same series of treatments, each unit block including a solution treatment module for supplying a treatment solution to a substrate, an ultraviolet irradiation module for irradiating a substrate with an ultraviolet ray, and a substrate carrying mechanism for carrying a substrate between the modules, the apparatus including:

an illuminance detection part that detects an illuminance of a light source of the ultraviolet irradiation module; and a control part that controls, when an illuminance detection value of the ultraviolet irradiation module in one unit block among the plurality of unit blocks becomes a set value or less, the delivery mechanism to stop delivery of a substrate to the one unit block and deliver subsequent substrates to another unit block, and the ultraviolet irradiation module to perform irradiation on substrates which have already been delivered to the one unit block with an irradiation time adjusted to a length according to the illuminance detection value.

A substrate treatment method according to the present invention is a substrate treatment method using a substrate treatment apparatus configured such that substrates in a same lot taken out of a carrier are distributed by a delivery mechanism into a plurality of unit blocks for performing a same series of treatments, each unit block including a solution treatment module for supplying a treatment solution to a substrate, an ultraviolet irradiation module for irradiating a substrate with an ultraviolet ray, and a substrate carrying mechanism for carrying a substrate between the modules, the method including the steps of:

detecting an illuminance of a light source of the ultraviolet irradiation module;

controlling, when an illuminance detection value of the ultraviolet irradiation module in one unit block among the plurality of unit blocks becomes a set value or less, the delivery mechanism to stop delivery of a substrate to the one unit block and deliver subsequent substrates to another unit block;

performing irradiation on substrates which have already been delivered to the one unit block with an irradiation time adjusted to a length according to the illuminance detection value; and changing the light source of the ultraviolet irradiation module in the one unit block after ending the irradiation of the substrates which have already been delivered to the one unit block.

A non-transitory storage medium according to the present invention is a non-transitory storage medium storing a computer program used in a substrate treatment apparatus configured such that substrates in a same lot taken out of a carrier are distributed by a delivery mechanism into a plurality of unit blocks for performing a same series of treatments, each unit block including a solution treatment module for supplying a treatment solution to a substrate, an ultraviolet irradiation module for irradiating a substrate with an ultraviolet ray, and a substrate carrying mechanism for carrying a substrate between the modules, the computer program having a group of steps installed to execute a substrate treatment method using the substrate treatment apparatus, wherein the substrate treatment method includes the steps of:

detecting an illuminance of a light source of the ultraviolet irradiation module;

controlling, when an illuminance detection value of the ultraviolet irradiation module in one unit block among the plurality of unit blocks becomes a set value or less, the delivery mechanism to stop delivery of a substrate to the one unit block and deliver subsequent substrates to another unit block;

performing irradiation on substrates which have already been delivered to the one unit block with an irradiation time adjusted to a length according to the illuminance detection value; and changing the light source of the ultraviolet irradiation module in the one unit block after ending the irradiation of the substrates which have already been delivered to the one unit block.

The present invention is configured to distribute substrates to a plurality of unit blocks for performing a same series of treatments, each unit block including a solution treatment module and an ultraviolet irradiation module. After an illuminance detection value of the ultraviolet irradiation module in one unit block becomes a set value or less, another unit block is used, and irradiation is performed on substrates which have already been delivered to the one unit block with an irradiation time adjusted to a length according to the illuminance detection value, and then a light source of the ultraviolet irradiation module is changed.

Accordingly, as compared to the case where the light source is periodically changed having a margin in consideration of variations in operating life of the light source, the light source can be used until a point in time close to the end of the operating life. Therefore, the cost can be reduced and the maintenance frequency is also decreased. Further, the irradiation time becomes longer than usual because the irradiation time is adjusted, however, the substrates that are the objects of so-called integrated irradiation are only substrates which have already been carried into the one unit block, resulting in suppression of a decrease in throughput of the whole.

Further, when the operating time of the light source of the ultraviolet irradiation module in the one unit block reaches a set time, delivery of a substrate to the unit block is stopped, and usual irradiation is performed on substrates which have already been delivered to the one unit block, whereby the set time can be set long because the method of integrated irradiation is also used. Then, by using both the integrated irradiation and the setting of the operating time, the probability of performing the integrated irradiation is decreased and a decrease in influence of the increased processing time of the substrate due to the integrated irradiation can be expected.

DETAILED DESCRIPTION OF THE INVENTION

First Embodiment

Figure 1:
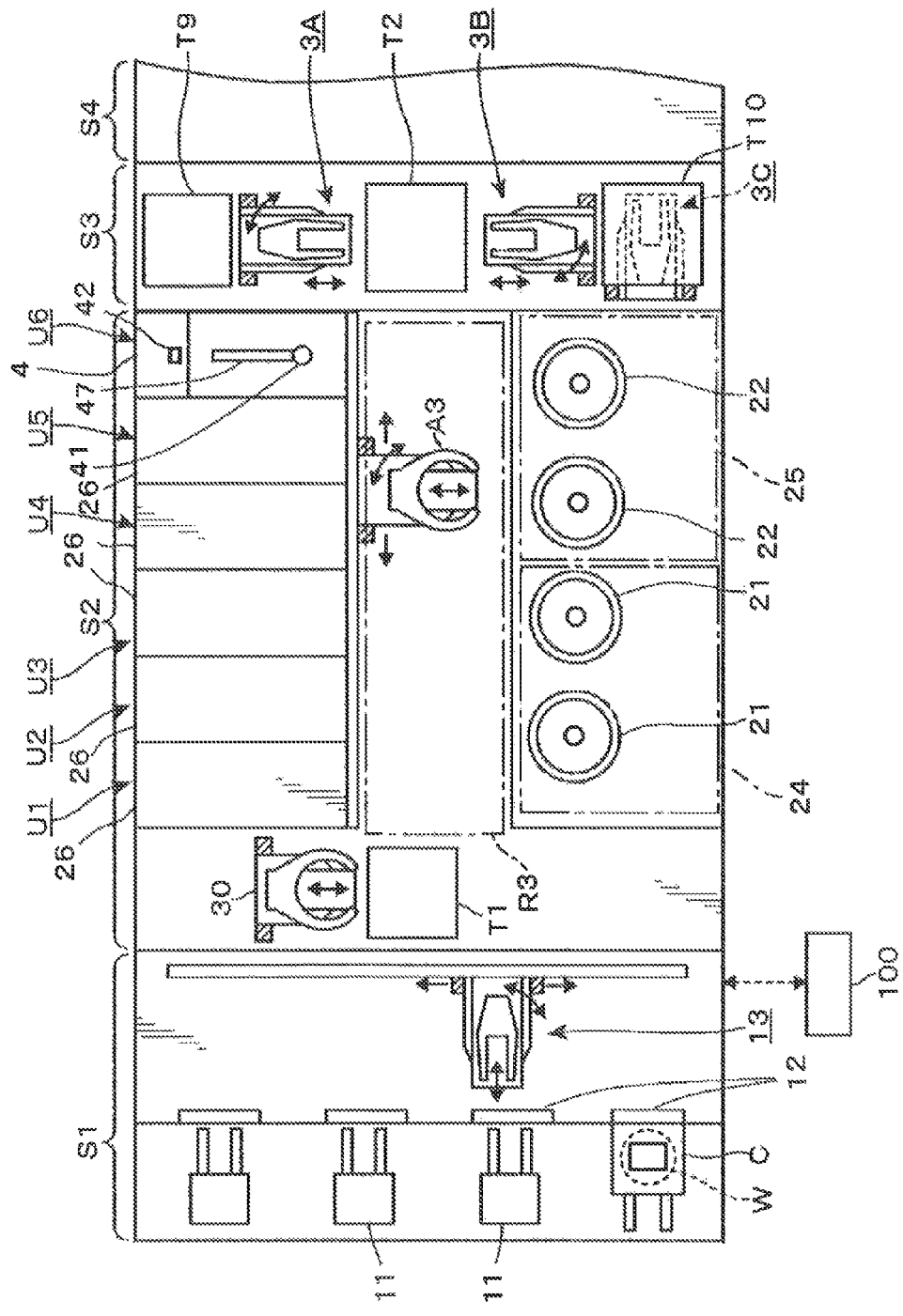
FIG. 1 is a plan view illustrating a substrate treatment apparatus of a first embodiment.

A first embodiment relating to a substrate treatment apparatus according to the present invention and a method thereof will be described. The outline of the whole substrate treatment apparatus (coating and developing apparatus) will be described first referring to FIG. 1 to FIG. 3. This coating and developing apparatus is composed of a carrier block S1, a treatment block S2, and an interface block S3 which are linearly connected. To the interface block S3, an exposure station S4 is further connected. In the following description, an arrangement direction of the blocks S1 to S3 is a front-back direction.

The carrier block S1 has a role to carry-in/out a carrier C containing a plurality of wafers W that are substrates in the same lot, and includes mounting tables 11 for carriers C, opening/closing parts 12, and a transfer mechanism 13 that is a carrying mechanism for carrying the wafer W from the carrier C via the opening/closing part 12.

The treatment block S2 is composed of first to sixth unit blocks B1 to B6 each performing a solution treatment on the wafer W which are stacked in order from the bottom. For convenience of description, a treatment of forming an anti-reflection film on the lower side of the wafer W, a treatment of forming a resist film on the wafer, and a treatment of forming a resist pattern on the wafer W after exposure are sometimes expressed as "BCT," "COT," and "DEV" respectively, and a unit block is expressed as a "floor" in FIG. 2 so as to avoid complexity of description.

In this example, two floors of each of the BCT floors, the COT floors, and the DEV floors are stacked in order from the bottom, and the COT floor (B3, B4) will be described as a representative referring to FIG. 1. Shelf units U1 to U6 are arranged in the front-back direction on one of right and left sides of a carry region R3 from the carrier block S1 to the interface block S3, and a resist coating module 24 and a protective film forming module 25 that are solution treatment modules are provided arranged in the front-back direction on the other side. The resist coating module 24 includes two cup units 21 and is configured such that the wafer W is held in the cup unit 21, a resist solution is supplied onto the wafer W from a chemical nozzle, and spin coting is performed. The protective film forming module 25 is configured such that a treatment is similarly performed with a chemical for forming a protective film using a cup module 22.

In the carry region R3, a carrier arm A3 that is a substrate carrying mechanism for carrying the wafer W is provided. The carrier arm A3 is configured to be movable forward and backward, movable up and down, rotatable around the vertical axis and movable in a direction of the length of the carry region R3, and can deliver the wafer W between modules in the unit block B3. Further, the shelf units U1 to U6 are arranged along the direction of the length of the carry region R3, and each of the shelf units U1 to U5 is configured such that heating modules 26 each performing heat treatment on the wafer W are stacked, for example, at two tiers. The shelf unit U6 is composed of edge exposure modules 4 stacked one above the other. The edge exposure module 4 corresponds to an ultraviolet irradiation module and is to irradiate and expose an edge portion of the wafer W after resist coating with/to an ultraviolet ray.

Figure 3:
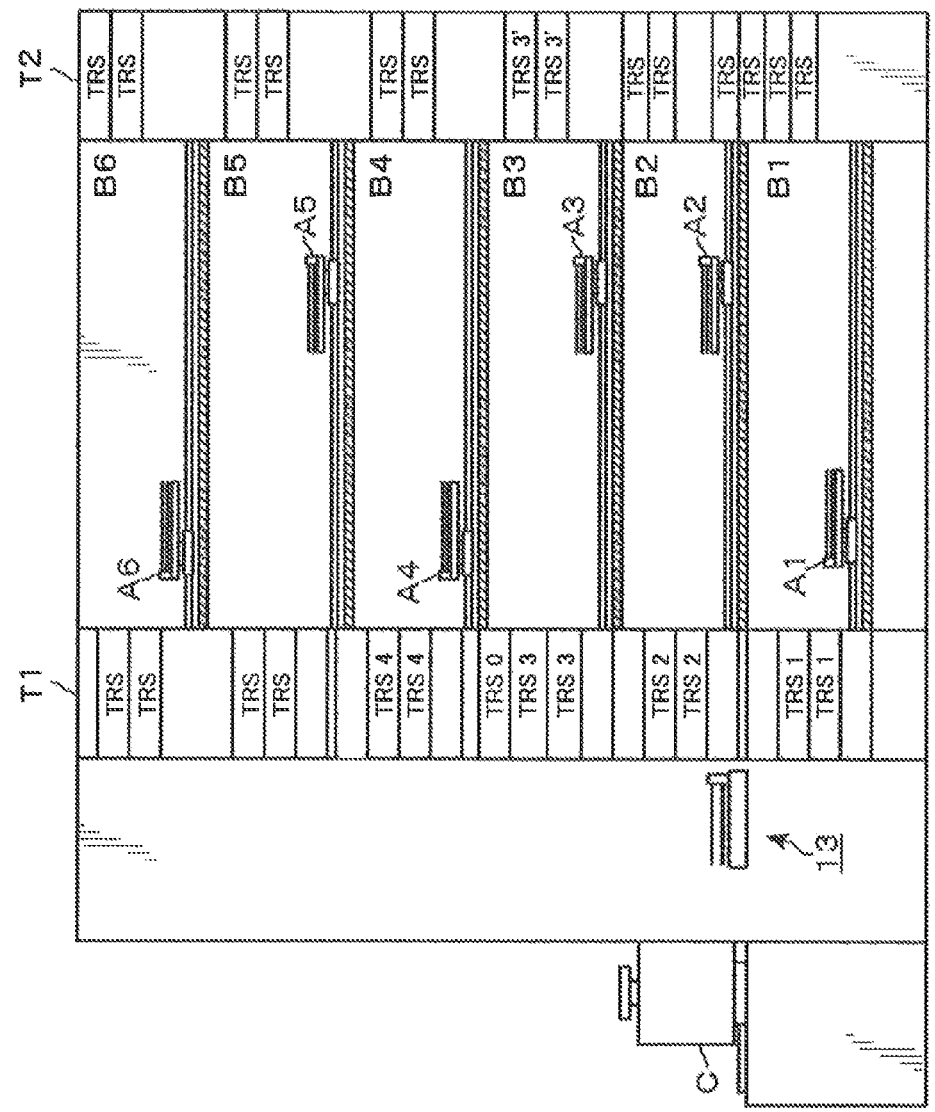
FIG. 3 is a longitudinal side view illustrating the substrate treatment apparatus.

The other unit blocks B1, B2, B5 and B6 are configured similarly to the unit blocks B3, B4 except that the chemical to be supplied to the wafer W is different and the heating module 26 is provided in place of the edge exposure module 4. The unit block B1, B2 includes an anti-reflection film forming module and the unit block B5, B6 includes a developing module, in place of the resist coating module 24 and the protective film forming module 25. In FIG. 3, carrier arms in the unit blocks B1 to B6 are indicated as A1 to A6.

On the carrier block S1 side in the treatment block S2, a tower T1 vertically extending throughout the unit blocks B1 to B6 and a delivery arm 30 that is a delivery mechanism movable up and down for delivering the wafer W to the tower T1 are provided. The tower T1 is composed of a plurality of modules stacked one above the other. As these modules, delivery modules provided at height positions of respective unit blocks, a temperature regulation module that delivers the wafer W, a buffer module that temporarily stores a plurality of wafers W, a hydrophobic treatment module that hydrophobizes the front surface of the wafer W and so on are actually provided. For simplification of description, these modules are delivery modules TRS each for delivering the wafer W between the delivery arm 30 and each of the carrier arms A1 to A6 of the unit blocks B1 to B6.

The interface block S3 includes towers T2, T9, T10 vertically extending throughout the unit blocks B1 to B6, and is provided with an interface arm 3A that is a delivery mechanism movable up and down for delivering the wafer W to the tower T2 and the tower T9, an interface arm 3B that is a delivery mechanism movable up and down for delivering the wafer W to the tower T2 and the tower T10, and an interface arm 3C for delivering the wafer W between the tower T2 and the exposure station S4. The tower T2 is composed of delivery modules TRS stacked one above the other. Note that T9 and T10 are also towers, but description thereof will be omitted here.

The outline of a carry path of the wafer W at usual time of a system composed of the coating and developing apparatus and the exposure station S4 will be briefly described. The wafer W flows in the order of the carrier C, the transfer mechanism 13, the delivery module TRS in the tower T1, the delivery arm 30, the delivery module TRS in the tower T1, the unit block B1 (B2), the unit block B3 (B4), the interface block S3, the exposure station S4, the interface block S3, the unit block B5 (B6), the delivery module TRS in the tower T1, the transfer mechanism 13, and the carrier C.

Describing the flow of the wafer W in the treatment block S2 in more detail, the unit blocks B1, B2 each forming an anti-reflection film, the unit blocks B3, B4 each forming a resist film, and the unit blocks B5 B6 each performing development are duplex, and a plurality of wafers W in the same lot are distributed and carried, namely, alternately to the duplex unit blocks. For example, when the wafer W is delivered to the unit block B1, the wafer W is delivered by the delivery arm 30 to the delivery module TRS1 (the delivery module to/from which the wafer W can be delivered by the carrier arm A1) corresponding to the unit block B1 among the delivery modules TRS in the tower T1. The module from which the delivery arm 30 receives the wafer W in the tower T1 is a delivery module TRS0 into which the wafer W is carried by the transfer mechanism 13.

When the delivery module corresponding to the unit block B2 is TRS2, the wafer W in the delivery module TRS0 is delivered by the delivery arm 30 to the delivery module TRS2. Accordingly, the wafers W in the same lot will be alternately distributed by the delivery arm 30 to the delivery modules TRS1, TRS2.

Further, the wafers W after the anti-reflection film is formed in the unit block B1 or B2 are distributed and carried alternately to the delivery module TRS3 corresponding to the unit block B3 and the delivery module TRS4 corresponding to the unit block B4, for example, via the delivery module TRS1 or TRS2.

Note that the delivery module indicated by TRS, TRSn (n=integer) also includes a structure capable of holding a plurality of wafers W.

Furthermore, the delivery module TRS is not limited to the one composed of one module, but may be composed of a plurality of modules.

Moreover, the wafers W after exposure are carried by the delivery arm in the interface block S3 alternately into the unit blocks B5, B6 via the delivery modules TRS in the tower T2.

Figure 4:
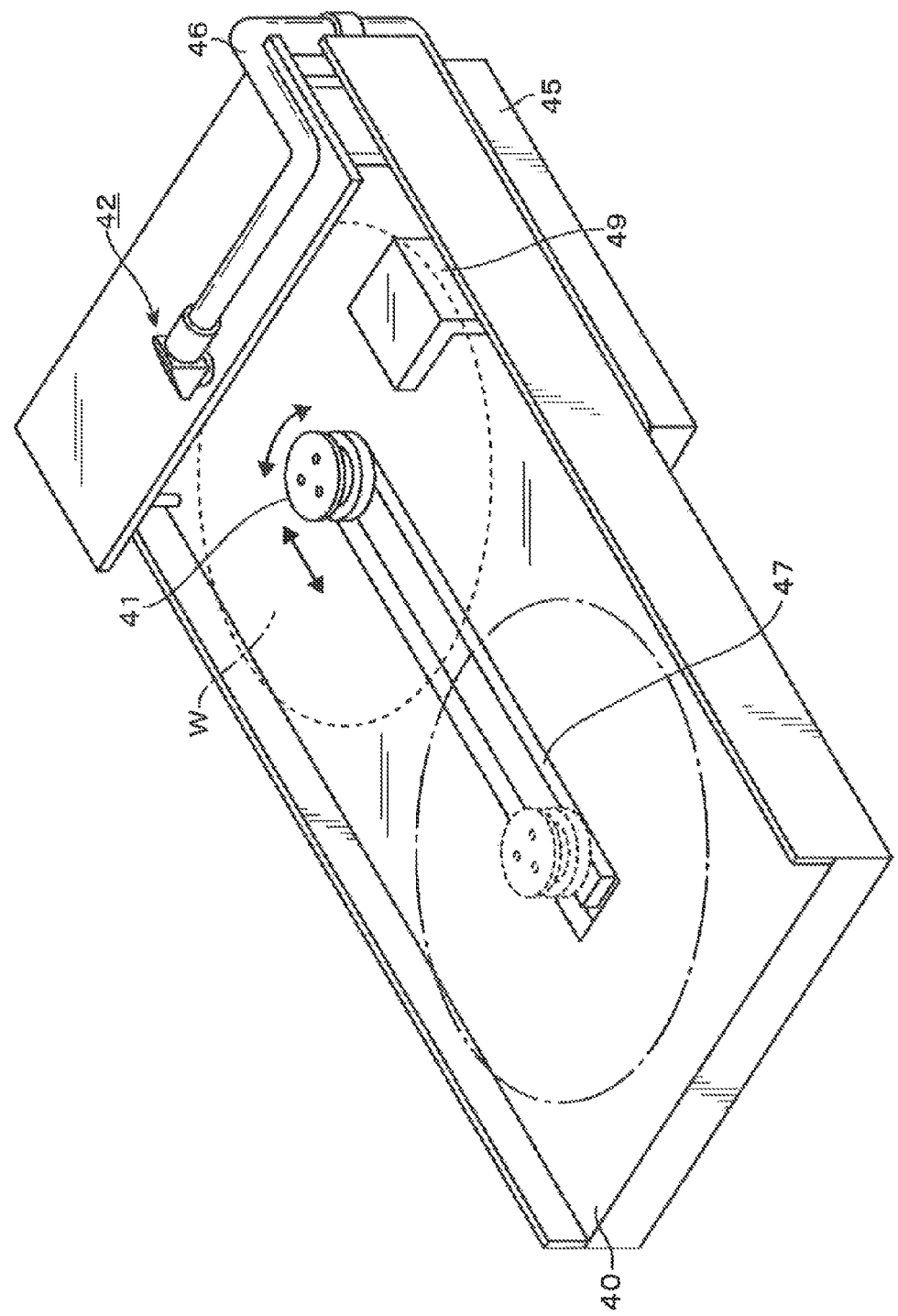
FIG. 4 is a perspective view illustrating an edge exposure module.

Subsequently, the edge exposure module 4 will be described. As illustrated in FIG. 4, the edge exposure module 4 includes a rectangular base 40, and an exposure part 42 that is an ultraviolet irradiation part. On the base 40, a rotary table 41 is provided which horizontally holds a wafer W and rotates the wafer W around the vertical axis and is movable by means of a drive mechanism, along a guide mechanism 47 extending in the direction of the length of the base 40.

Figure 2:
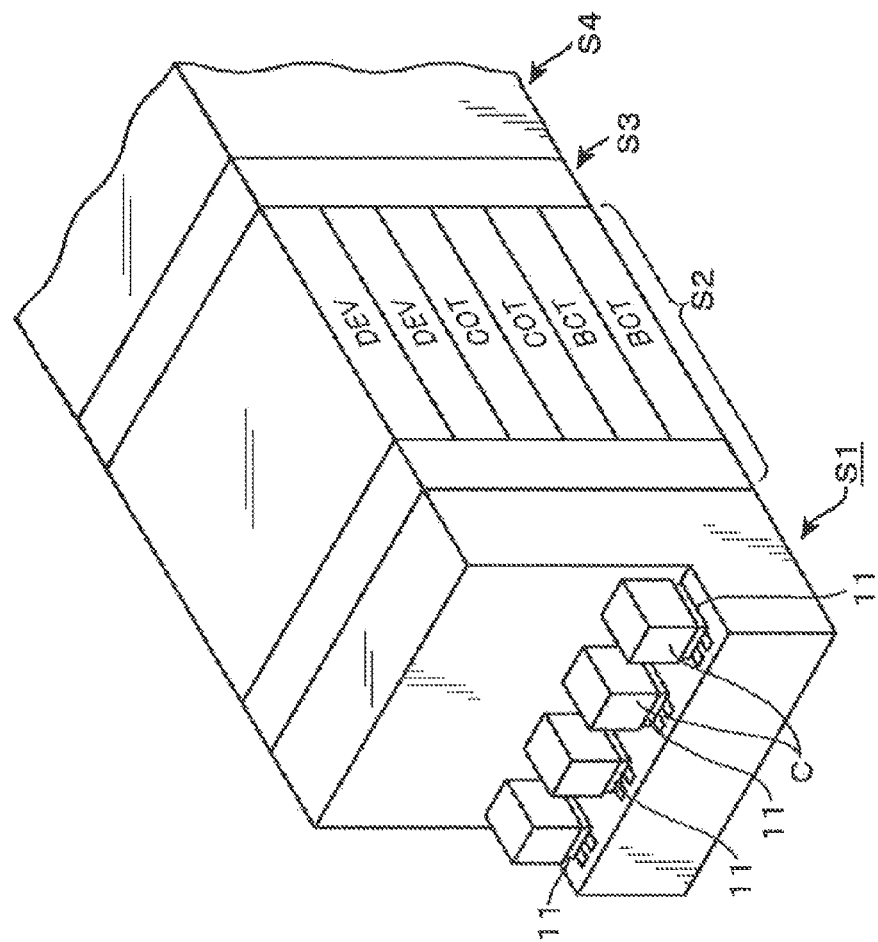
FIG. 2 is a perspective view illustrating the substrate treatment apparatus.

The base 40 is disposed such that its front side faces the carry region R3 in FIG. 1. In FIG. 4, the position of the wafer W indicated by a one-dotted chain line is a delivery position where the wafer W is delivered by the carrier arm A3 to/from the rotary table 41 and the position of the wafer W on the back side indicated by a broken line is a processing position.

Figure 5:
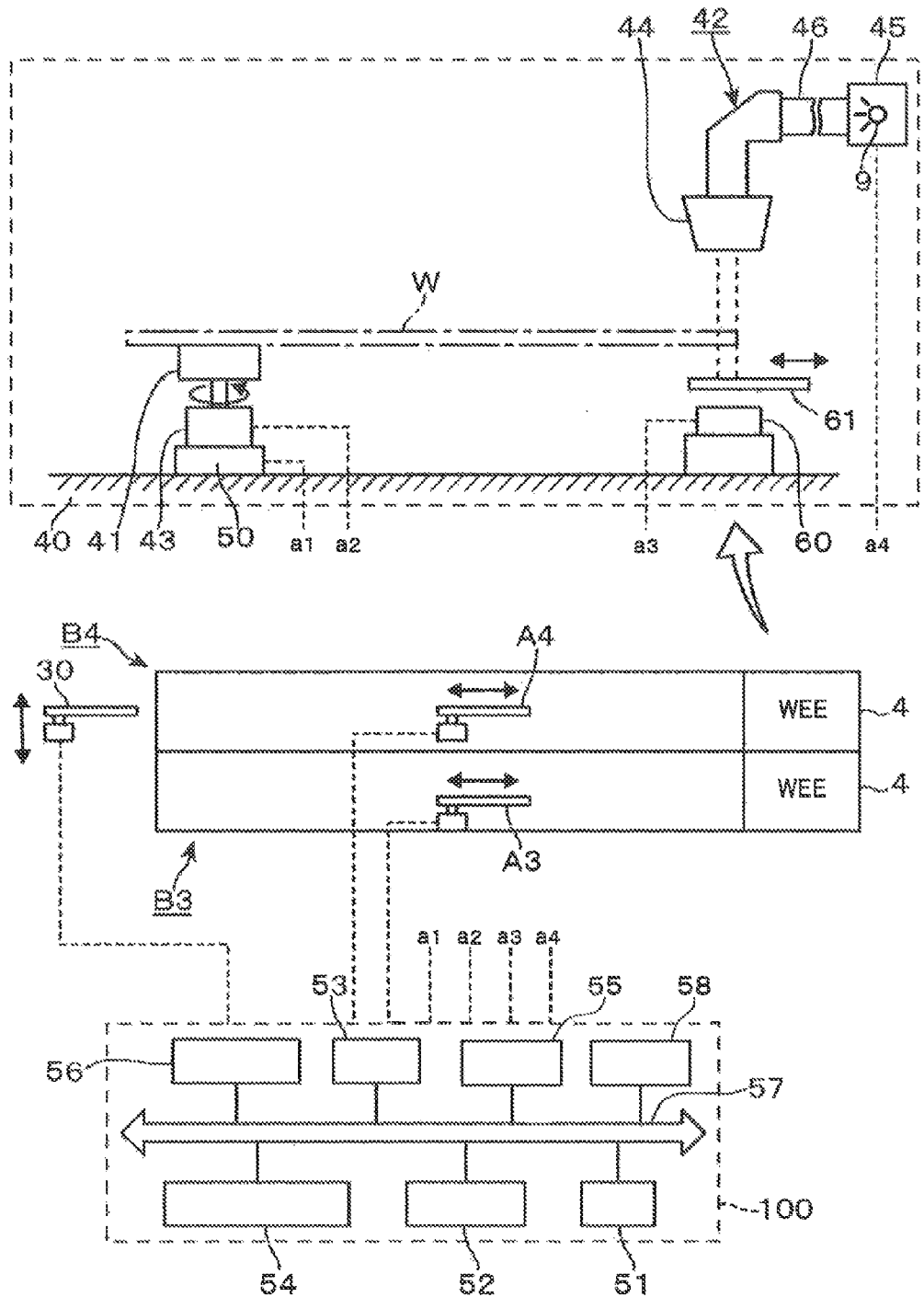
FIG. 5 is an explanatory view illustrating a control part of the substrate treatment apparatus.

An exposure part 42 includes a lamp house 45 provided below the base 40 and, for example, an ultraviolet lamp that is a light source radiating an ultraviolet ray, for example, a mercury lamp, a xenon lamp or the like is provided in the lamp house 45. From the lamp house 45, an optical path member 46 guiding the light of the light source, for example, the ultraviolet ray to a light irradiation end 44 extends out as illustrated in FIG. 4 and FIG. 5. The light irradiation end 44 includes optical system members such as a mirror and a lens and a mask for dividedly forming an exposure region, and is disposed above the wafer W to expose the edge portion of the front surface of the wafer W placed at the processing position.

The base 40 is further provided with an edge detection part 49 provided with a light emitting part and a light receiving part above and below a passage region of an edge respectively in order to detect the edge of the wafer W placed at the processing position.

Referring also to FIG. 5 for explaining a later-described control system, an illuminance detection part 60 that detects the illuminance of light from the light irradiation end 44 is provided below the passage region of the edge portion of the wafer W and directly under the light irradiation end 44 (the light irradiation region of the light irradiation end 44). Between the passage region of the edge portion of the wafer W and the illuminance detection part 60, a shutter 61 is disposed for receiving or shutting the light from the light irradiation end 44 to the illuminance detection part 60.

Describing processing in the edge exposure module 4, a wafer W is delivered from the carrier arm A3 (A4) in the unit block B3 (B4) to the rotary table 41, and the rotary table 41 moves to the back side to place the wafer W at the processing position. Next, the wafer W is rotated one revolution so that the edge detection part 49 optically detects the edge of the wafer W. Thereafter, exposure is performed on the edge portion of the front surface of the wafer W with the ultraviolet ray from the exposure part 42 (in more detail, the light irradiation end 44) and the wafer W is rotated, whereby exposure (edge exposure) is performed over the entire circumference of the wafer W. For rotating the wafer W, the position of the rotary table 41 (the position in the direction in which the guide mechanism 47 extends) is adjusted by a moving part 50 on the basis of the detection result of the edge detection part 49 so that an exposure width becomes uniform. Thereafter, the wafer W is returned by the moving part 50 to the delivery position, and received by the carrier arm A3 (A4).

FIG. 5 illustrates portions intimately related to the present invention of the control system of the coating and developing apparatus. The diagram at the middle section of FIG. 5 schematically illustrates the unit blocks B3, B4. The already-described delivery arm 30 and carrier arms A3, A4 in the unit blocks B3, B4 are controlled by control signals from a control part 100. The control part 100 is not limited to the one corresponding to one computer but may be the one corresponding to a system composed of a host computer and controllers controlling the respective mechanisms.

The view at the upper section of FIG. 5 schematically illustrates a main part of the edge exposure module 4, and a rotation mechanism 43 rotating the rotary table 41 and the moving part 50 moving the rotary table 41 are controlled by control signals from the control part 100. Further, a lamp 9 that is the light source of the exposure part 42 is turned on and off and its illuminance is adjusted, by a control signal from the control part 100. The illuminance detection part 60 is configured to transmit an illuminance detection value to the control part 100.

The control part 100 has a CPU 51, a program 52, a carry schedule 54, a memory 53, a time counter 55, an alarm generation part 58, and a treatment recipe 56 which are connected to a bus 57. The carry schedule 54 is time-series data in which wafers and modules are arranged such that which wafers are to be placed in which modules. The treatment recipe 56 is data in which treatment conditions of the modules performing respective treatments are written.

The program 52 contains programs required for operating the coating and developing apparatus such as a program for outputting control signals to the transfer mechanism 13, the delivery arm 30, the carrier arms A1 to A6, the interface arms 3A to 3C in the interface block S3 and so on referring to the carry schedule 54, a program for controlling the modules referring to the treatment recipe 56, a program including steps, when a failure occurs, for example, in a treatment module in the unit blocks B1 to B6, such as how to carry the wafer W and what kind of handling to perform on the treatment module, and so on.

The program 52 further contains a program for executing processing in the case where the illuminance of the edge exposure module 4 is below a set value or in the case where the operating time exceeds a set time, so that the edge exposure module 4 is operated as in a later description of operation by this program.

Note that the carry schedule 54, the treatment recipe 56 and the program 52 are stored in a memory, but illustration of the memory part storing them is omitted in FIG. 5 for convenience.

The memory 53 in the control part 100 stores the illuminance set value and the set time of the operating time of the edge exposure module 4, and the time counter 55 is to count the operating time after the lamp 9 is changed in the edge exposure module 4. To count the operating time, a method of connecting a counter (timer) that is a device as the time counter to the bus 57 may be used, but the time may be counted by software. Alternatively, for example, a counter may be provided in the edge exposure module 4 to transmit its count value to the host computer, in which case the counter constitutes a part of the control part 100. The alarm generation part 58 is to generate an alarm and notify an operator when changing the carry schedule 54 and the treatment recipe 56.

The whole series of steps of the wafer W taken out of the carrier C in the carrier block S1 and returned to the carrier C have already been described, and therefore the appearance of the treatments in the treatment block S2 including the carry of the wafer W before exposure relating to the present invention will be described here. First, the wafers W in the same lot are distributed to the unit blocks B1, B2 as already described and subjected to the same treatments to have the anti-reflection film formed thereon, and then carried to the delivery module TRS1 or TRS2 in the tower T1 corresponding to each unit block B1, B2.

Subsequently, the wafers W mounted on the delivery module TRS1 or TRS2 are sequentially distributed and (alternately) delivered by the delivery arm to the delivery modules TRS3, TRS4 in the tower T1 corresponding to the unit blocks B3, B4 respectively. The distribution and carry is performed on the basis of the carry schedule 54 in the control part 100 illustrated in FIG. 5 such that, for example, the wafers W with odd numbers in the lot are delivered to the unit block B3 and the wafers W with even numbers in the lot are delivered to the unit block B4.

For example, the wafer W delivered to the delivery module TRS3 is delivered by the carrier arm A3 in the unit block B3 to the resist coating module 24 in which a resist is applied. In more detail, a temperature regulation function for the wafer W is added in the delivery module TRS1 or TRS2 at the preceding stage so that the wafer W before application of the resist is regulated to have a temperature suitable for application of the resist solution. Subsequently, the wafer W is subjected to a heat treatment in the heating module 26, further coated with the chemical for protective film in the protective film forming module 25, and further subjected to a heat treatment in the heating module 26. In this example, in the heating module 26, a cooling plate serving also as a transfer arm is provided adjacent to a heating plate and cools the wafer W after the heat treatment.

Thereafter, the wafer W is carried into the edge exposure module 4 and subjected to edge exposure by the exposure part 42 while the wafer W is being rotated by the rotary table 41 as already described. Thereafter, the wafer W is delivered by the carrier arm A3 to a delivery module TRS3' in the tower T2 in the interface block S3, and then transferred via the interface arm 3C in the interface block S3 to the exposure station S4 performing pattern exposure. The wafer W delivered to the delivery module TRS4 in the tower T1 is also carried into the unit block B4 and subjected to the same treatments.

Figure 6:
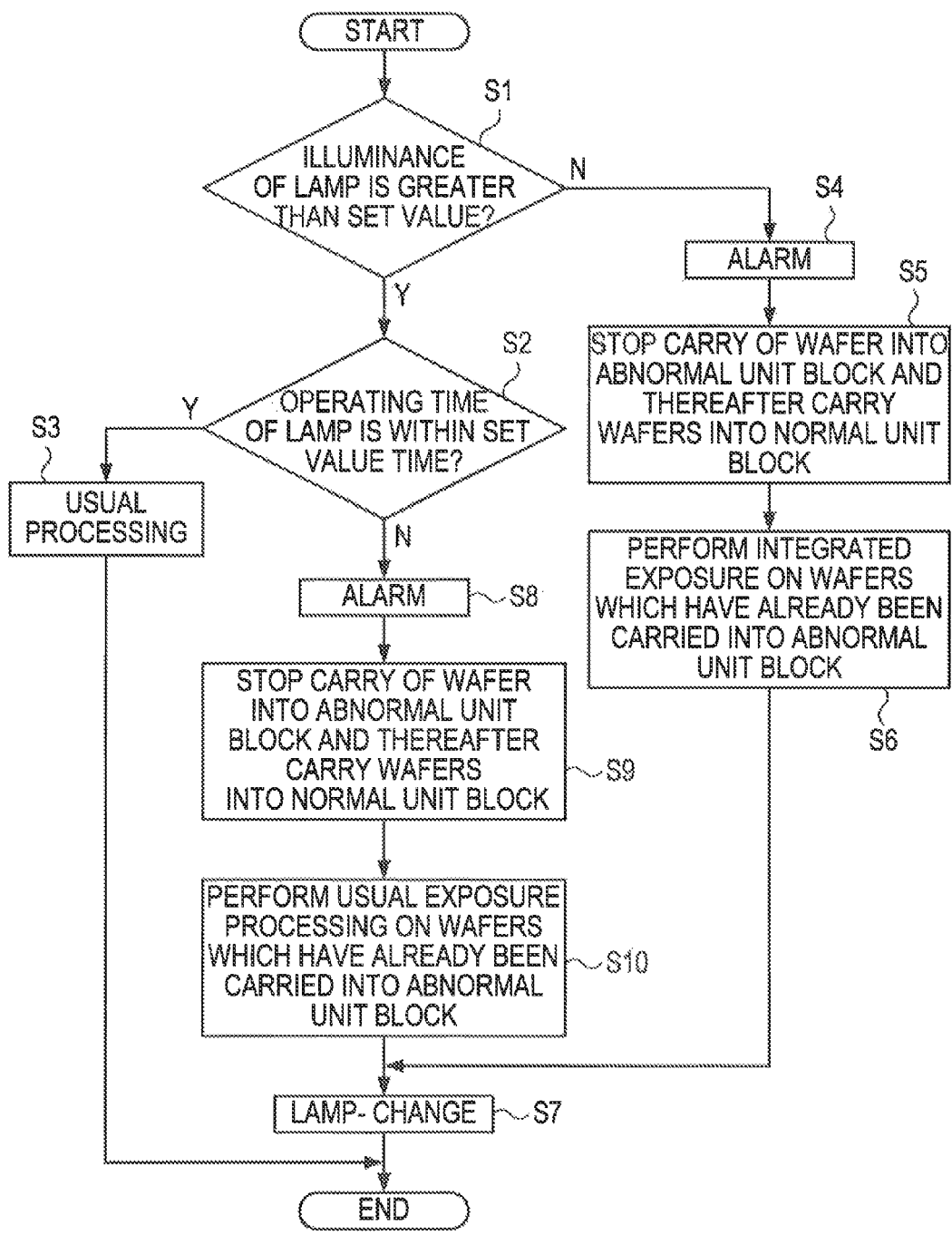
FIG. 6 is a flowchart for explaining substrate processing steps of the first embodiment.

Next, description of the relation between the state of the edge exposure module 4 and the carry of the wafer W will be pursued referring to FIG. 6 to FIG. 9. FIG. 6 is a diagram illustrating the carry or the flow of processing of the wafer W in the form of a flowchart. As already described, before the wafer W is placed at the processing position, the shutter 61 is opened, the illuminance of exposure from the exposure part 42 of the edge exposure module 4 is detected by the illuminance detection part 60, and whether the illuminance detection value is lower than the previously set illuminance set value is monitored by the program 52 in the control part 100 (Step S1). Where the illuminance of the exposure part 42 at usual time is a reference illuminance, the illuminance gradually decreases as the operating life of the lamp 9 approaches the end and finally reaches an illuminance with which exposure is impossible even if the exposure time is adjusted. Where the final illuminance is the lower limit illuminance, the illuminance set value is a value corresponding to an intermediate value between the reference illuminance and the lower limit illuminance.

When the illuminance detection value is a value higher than the illuminance set value, the result at Step S1 is "YES" and therefore whether the operating time of the lamp 9 (the lapse time during which a new lamp 9 is turned on) exceeds the set time is determined (Step S2). The set time may be, for example, the operating life prescribed by the specifications of the lamp 9. In this case, there actually are variations in operating life among individual lamps 9, and it is therefore believed that there are a lamp which can be still used when its operating time reaches the set time and a lamp which becomes unusable before its operating time reaches the set time. In the case where only the monitoring of the operating time is performed, if the latter lamp 9 is used, the lamp 9 suddenly becomes unusable. Such a situation is not caused in this embodiment because the illuminance of the exposure part 42 is also monitored at Step S1. Further, the set time may be time slightly longer than the operating life prescribed by the specifications of the lamp 9 or time slightly shorter than the operating life.

Figure 7:
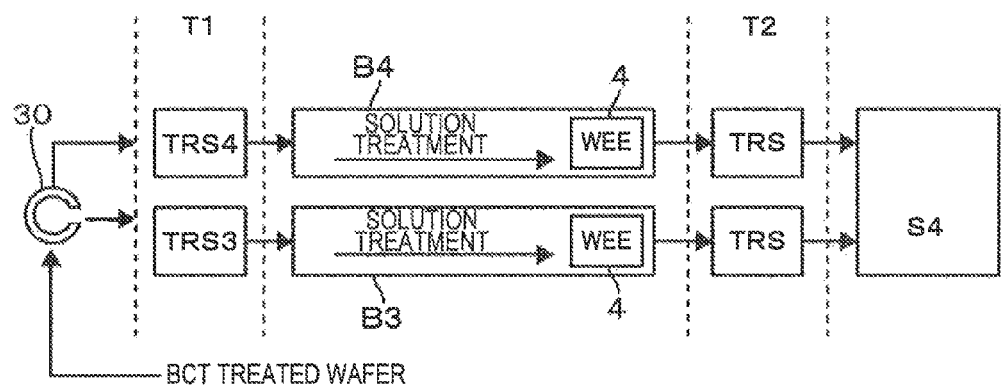
FIG. 7 is an explanatory diagram illustrating processing steps when the illuminance of a light source of the substrate treatment apparatus according to the first embodiment has deteriorated.

When the operating time of the lamp 9 has not reached the set time at Step S2, usual processing is proceeded. Namely, as illustrated in FIG. 7, the wafer W for which the treatment has been completed in the unit block B1 or B2 is distributed and delivered by the delivery arm 30 to the delivery module TRS3, TRS4 in the tower T1, and then carried into the unit block B3, B4. The distribution of the wafer W is performed at a point in time when the wafer W is delivered to the delivery module TRS3, TRS4, and the wafer W placed in the delivery module TRS3 (TRS4) is carried by the carrier arm A3 (A4) in the unit block B3 (B4). Therefore, the delivery module TRS3 (TRS4) can be considered as one of the modules constituting the unit block B3 (B4).

The wafer W carried into the unit block B3, B4 is treated as already described, and subjected to usual exposure processing in the edge exposure module 4 (Step S3).

On the other hand, when the illuminance detection value becomes the illuminance set value or less, the result at Step S1 is "NO" and the alarm generation part 58 is driven to generate an alarm (Step S4), and a special mode different from that at usual time is executed (Step S5). As examples of the alarm include, for example, a warning sound, lighting of an alarm lamp provided in the coating and developing apparatus and so on. Further, information such as in which unit block the illuminance of the exposure part 42 has decreased may be displayed on an operation screen of the coating and developing apparatus.

Figure 8:
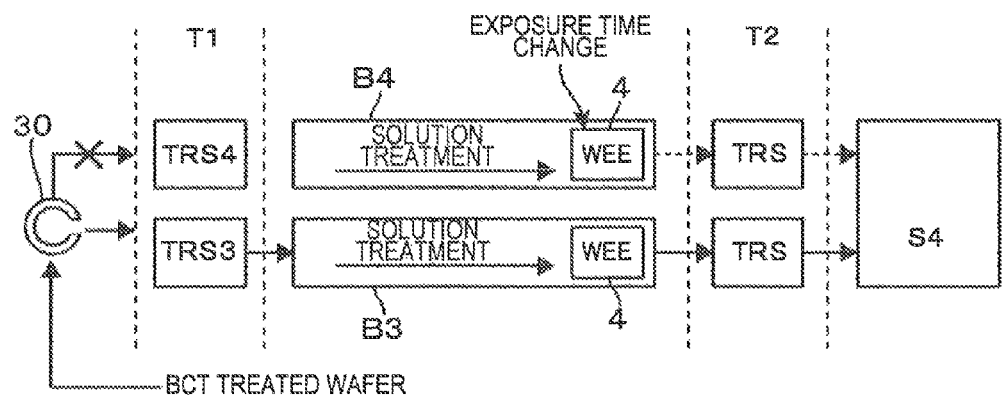
FIG. 8 is an explanatory diagram illustrating processing steps when the illuminance of the light source of the substrate treatment apparatus according to the first embodiment has deteriorated.

In the special mode, assuming that the unit block to which the exposure part 42 whose illuminance has decreased belongs is called an abnormal unit block for convenience, carry of the wafer W into the abnormal unit block is stopped, and the wafers W that are scheduled to be carried into the abnormal unit block are carried into a normal unit block among the unit blocks B3, B4 (FIG. 8). The change in carry of the wafers W is performed by rewriting the carry schedule 54 in the control part 100.

The carry schedule 54 is data in which the group of modules which are carry destinations of the wafers W are described in time series, so that if the delivery arm 30 has already started the delivery operation to the delivery module TRS3 or TRS4 that is the carry source at the time when the carry schedule 54 is rewritten, the wafer W relating to the delivery operation is carried into the unit block B3 or B4. Note that in this case, the software may be devised so that even the wafer W relating to the delivery operation may be carried into the normal unit block (B3 or B4).

Figure 9:
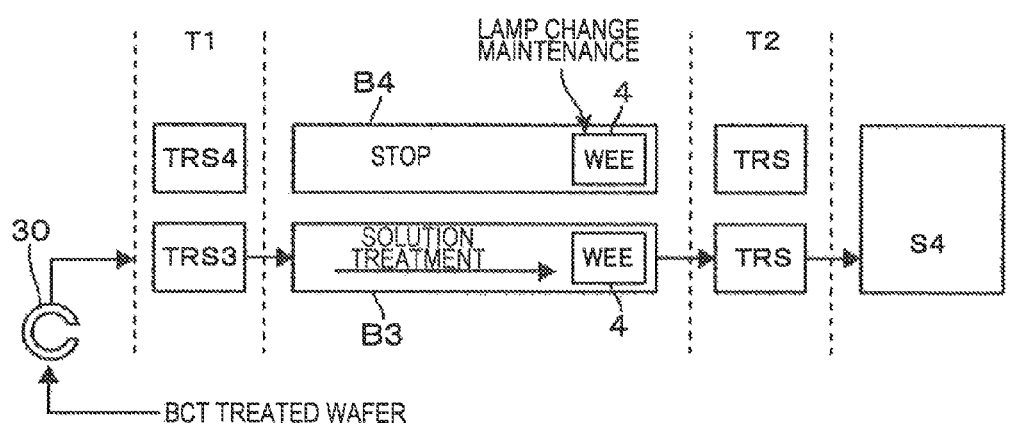
FIG. 9 is an explanatory diagram illustrating processing steps when the illuminance of the light source of the substrate treatment apparatus according to the first embodiment has deteriorated.

The wafers W which have already been carried into the abnormal unit block (B3 or B4) are subjected to the processing similarly to the usual case except that the edge exposure time is adjusted (Step S6). In the edge exposure module 4, the exposure amount is calculated by {illuminance×rotation speed×exposure angle×irradiation mask opening region/peripheral length of exposure portion}. When the illuminance of the lamp 9 is below the illuminance set value, the rotation speed of the rotary table 41 when the edge exposure is performed is changed to a speed calculated by {reference illuminance×rotation speed in usual case/illuminance detection value} to increase and adjust the light irradiation time per unit area of the edge portion of the wafer W so as to sufficiently perform edge exposure even by the lamp 9 having an illuminance set value below the illuminance set value. After end of the processing on the wafers W remaining in the abnormal unit block, the lamp 9 is turned off at Step S7, and the lamp 9 in the edge exposure module 4 is changed. Further, carry into the normal unit block (B3 or B4) is continued and treatments and processing are performed similarly to the usual case as illustrated in FIG. 9.

Further, when the illuminance of the lamp 9 is greater than the set value but the operating time of the lamp 9 exceeds the set time, the result at Step S1 is "YES" and the result at Step S2 is "NO." The alarm generation part 58 is driven to generate an alarm (Step S8) and carry of the wafer W into the abnormal unit block is stopped as with already-described Step S5 (Step S9), and then the wafers W which have already been carried in are subjected to the processing similarly to the usual case (Step S10), and the lamp 9 is turned off at Step S7, and the lamp 9 in the edge exposure module 4 is changed.

Note that in the flow illustrated in FIG. 6, the order of Step S1 and Step S2 may be reverse.

According to the above embodiment, the wafers are distributed and delivered to a plurality of unit blocks each of which includes the solution treatment modules for forming the coating films including the resist film and the edge exposure module 4 and performs the same series of treatments. Then, after the illuminance detection value of the edge exposure module 4 in one unit block becomes the set value or less, the other unit block is used, the wafers W which have already been delivered to the one unit block are subjected to edge exposure with the exposure time adjusted to the length corresponding to the illuminance detection value, and then the lamp 9 in the edge exposure module 4 is changed.

Accordingly, as compared to the case where the lamp 9 is periodically changed having a margin in consideration of variations in operating life of the lamp 9, the lamp 9 can be used until a point in time close to the end of the operating life. Therefore, the cost can be reduced and the maintenance frequency is also decreased. Further, the exposure time becomes longer than usual because the exposure time is adjusted, however, the wafers W that are the objects of so-called integrated irradiation (integrated exposure) are only wafers W which have already been carried into the one unit block, resulting in suppression of a decrease in throughput of the whole.

Further, when the operating time of the lamp 9 of the edge exposure module 4 in the one unit block reaches the set time, delivery of a wafer W to the unit block is stopped, and usual edge exposure is performed on wafers W which have already been delivered to the one unit block, whereby the operating time can be set long because the method of integrated exposure is also used. Then, by using both the integrated exposure and the setting of the operating time, the probability of performing the integrated exposure is decreased and a decrease in influence of the increased processing time of the wafer W due to the integrated exposure can be expected.

Figure 10:
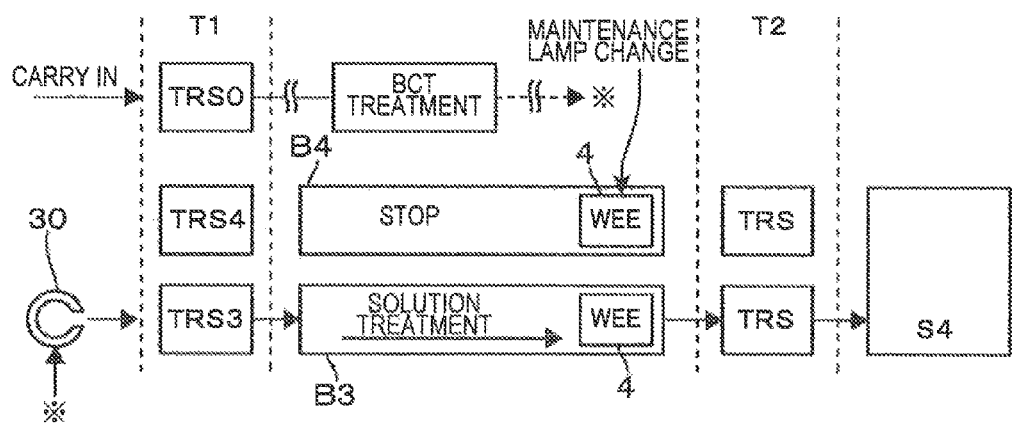
FIG. 10 is an explanatory diagram illustrating processing steps when the illuminance has deteriorated during change of a lamp.

In the flowchart in FIG. 6, the case where the illuminance detection value becomes the illuminance set value or less during the change or the maintenance of the lamp 9 is not assumed because of a very low probability. The processing steps in that case will be described using FIG. 10 to FIG. 12. An example of handling in the case where when some kind of trouble has occurred or maintenance or the like is being performed in one of the unit blocks B3, B4, for example, the unit block B4 as illustrated in FIG. 10 and carry of a wafer W into the unit block B4 is therefore stopped, the illuminance detection value of the edge exposure module 4 becomes the set value or less in the other unit block B3 will be described.

Figure 11:
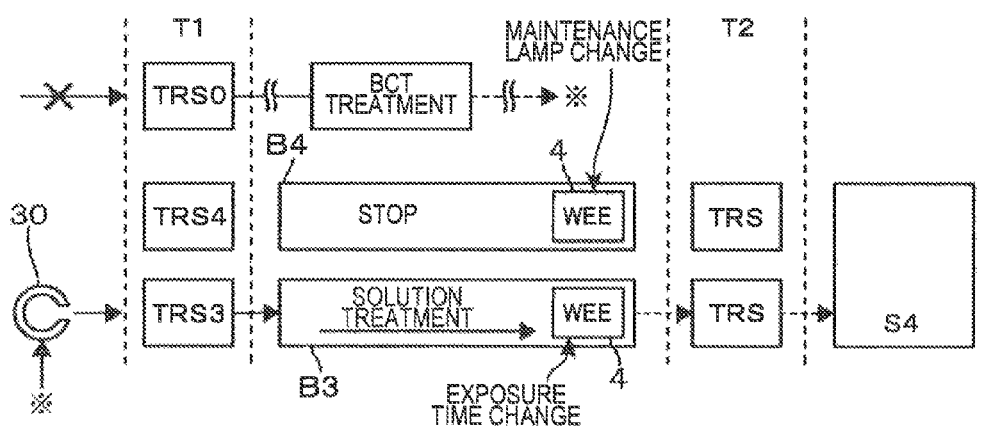
FIG. 11 is an explanatory diagram illustrating processing steps when the illuminance has deteriorated during change of the lamp.

In this case, the carry-in by the delivery arm 30 to the unit block B3 is not stopped but taking of a wafer W out of the carrier C in the carrier block S1 is stopped as illustrated in FIG. 11. Then, the wafers W which have already been taken out of the carrier C are carried into the unit block B3 and the treatments on the wafers W are continued only in the unit block B3. In the edge exposure module 4, the edge exposure processing is continued in the integrated exposure mode as has been described at Step S5.

Figure 12:
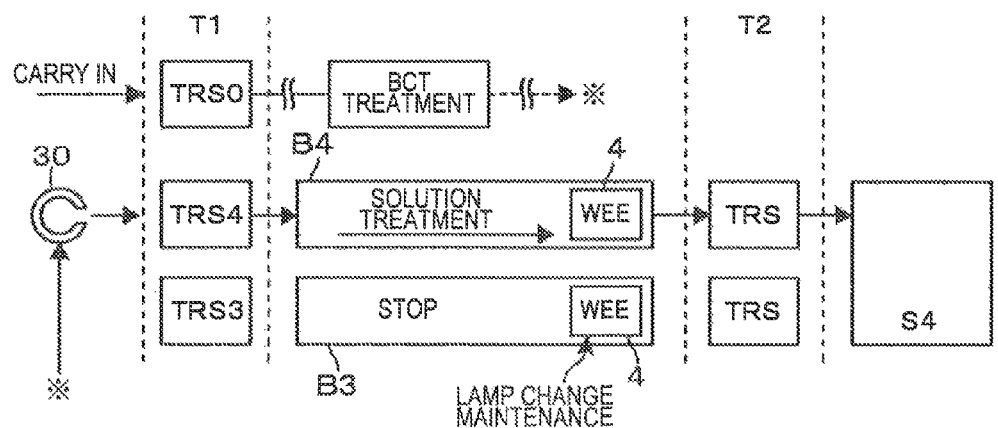
FIG. 12 is an explanatory diagram illustrating processing steps when the illuminance has deteriorated during change of the lamp.

Note that the illuminance lower limit lower than the already-described illuminance set value is stored in the memory 53 in the control part 100 so that when the illuminance detection value reaches the illuminance lower limit value, the processing on the wafers W is stopped. After the maintenance of the unit block B4 into which the carry-in of a wafer W is stopped ends and the unit block B4 becomes operable, an alarm is generated and notified to the operator, taking of a wafer W out of the carrier C in the carrier block S1 is resumed and the wafer W is carried into the unit block B4 as illustrated in FIG. 12. The wafers W which have already been carried in the unit block B3 are subjected to the treatments in the unit block B3 and to the integrated exposure in the edge exposure module 4. After the treatments on the wafers W in the unit block B3 end, the lamp 9 is quickly changed.

According to this embodiment, there provided is an advantage capable of suppressing a decrease in productivity because the processing is performed on the wafers W utilizing the unit module in which the illuminance of the lamp 9 in the edge exposure module 4 becomes the set value or less although abnormality has occurred in each unit module. A generalized technique including the case in which two floors of unit modules performing the same series of treatments are provided in the above example and also including the case in which three floors or more are provided for implementing the handling method is as follows. Specifically, when the illuminance detection value of the edge exposure module 4 in one unit block of a plurality of unit modules becomes the set value or less and all of other unit blocks are unusable, taking of a wafer W out of the carrier C is stopped. Further, the wafers W which have already been taken out of the carrier C are carried into the one unit block and subjected to edge exposure with the edge exposure time adjusted to the length corresponding to the illuminance detection value.

Further, taking of a wafer W out of the carrier C is not stopped but all of the wafers W in the carrier C may be taken out and taking out of the next carrier C may be stopped.

Second Embodiment

Though the above embodiment is the present invention applied to the coating and developing apparatus, the present invention is not limited to the coating and developing apparatus but may be applied to another substrate treatment apparatus. As a concrete example, a wet-type cleaning apparatus performing treatment after dry etching or the like. The cleaning apparatus can be configured such that unit blocks are stacked at a plurality of tiers, for example, two tiers each including a plurality of single-wafer cleaning treatment modules each cleaning a substrate with a cleaning solution, an ultraviolet irradiation module (hereinafter, referred to as a "UV irradiation module"), and a substrate carrying mechanism carrying the substrate between the modules.

The UV irradiation module is to remove an organic substance adhering to the front surface of the substrate by irradiating the substrate with an ultraviolet ray, and its concrete structure will be described later.

The cleaning treatment module includes a spin chuck disposed in a cup and a nozzle discharging the cleaning solution to a center of the substrate held on the spin chuck, and is configured to spread the cleaning solution over the entire front surface of the substrate by rotating the spin chuck to clean the front surface. As the treatments of the cleaning treatment module include cleaning with a chemical, subsequent cleaning with pure water, and thereafter drying process (spin drying).

Figure 13:
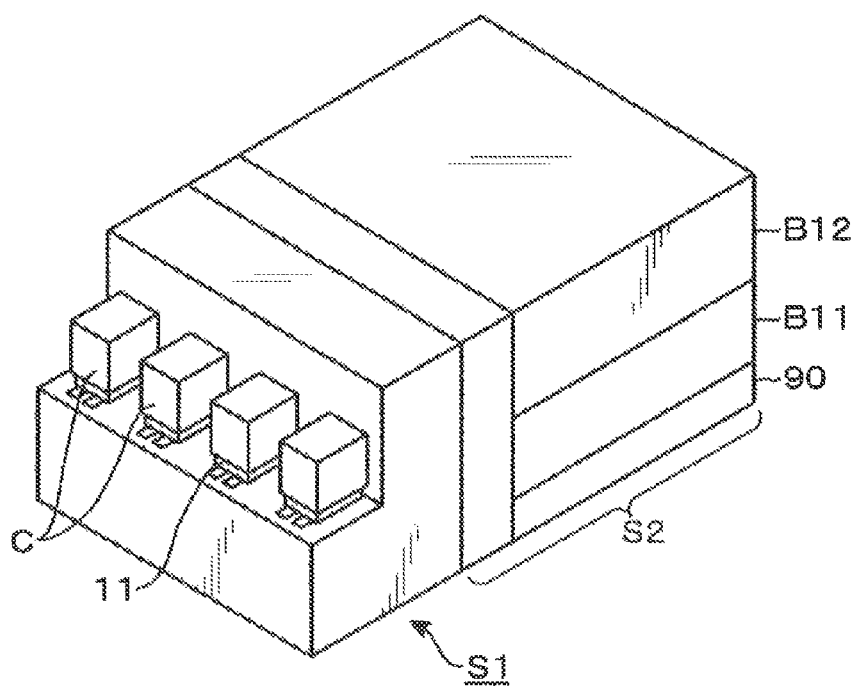
FIG. 13 is a perspective view illustrating a substrate treatment apparatus of a second embodiment.

FIG. 13 illustrates an external appearance of the cleaning apparatus that is the substrate treatment apparatus in which unit blocks B11, B12 for cleaning are stacked at two tiers on a chemical block 90 housing a bottle of the cleaning solution and the like.

Each unit block B11, B12 includes a substrate carrying mechanism moving along a linear carry region illustrated in FIG. 1, a plurality of cleaning treatment modules arranged to line up along the linear carry region on both right and left sides of the linear carry region, and an UV irradiation module provide at a position accessed by the substrate carrying mechanism. An example of layout includes an example in which six cleaning treatment modules are arranged in a line on the left side and five cleaning treatment modules and one UV irradiation module are arranged on the right side.

In FIG. 13, the configuration is the same as that in the preceding embodiment except the unit blocks and the same numerals and symbols are given to the corresponding regions.

Figure 14:
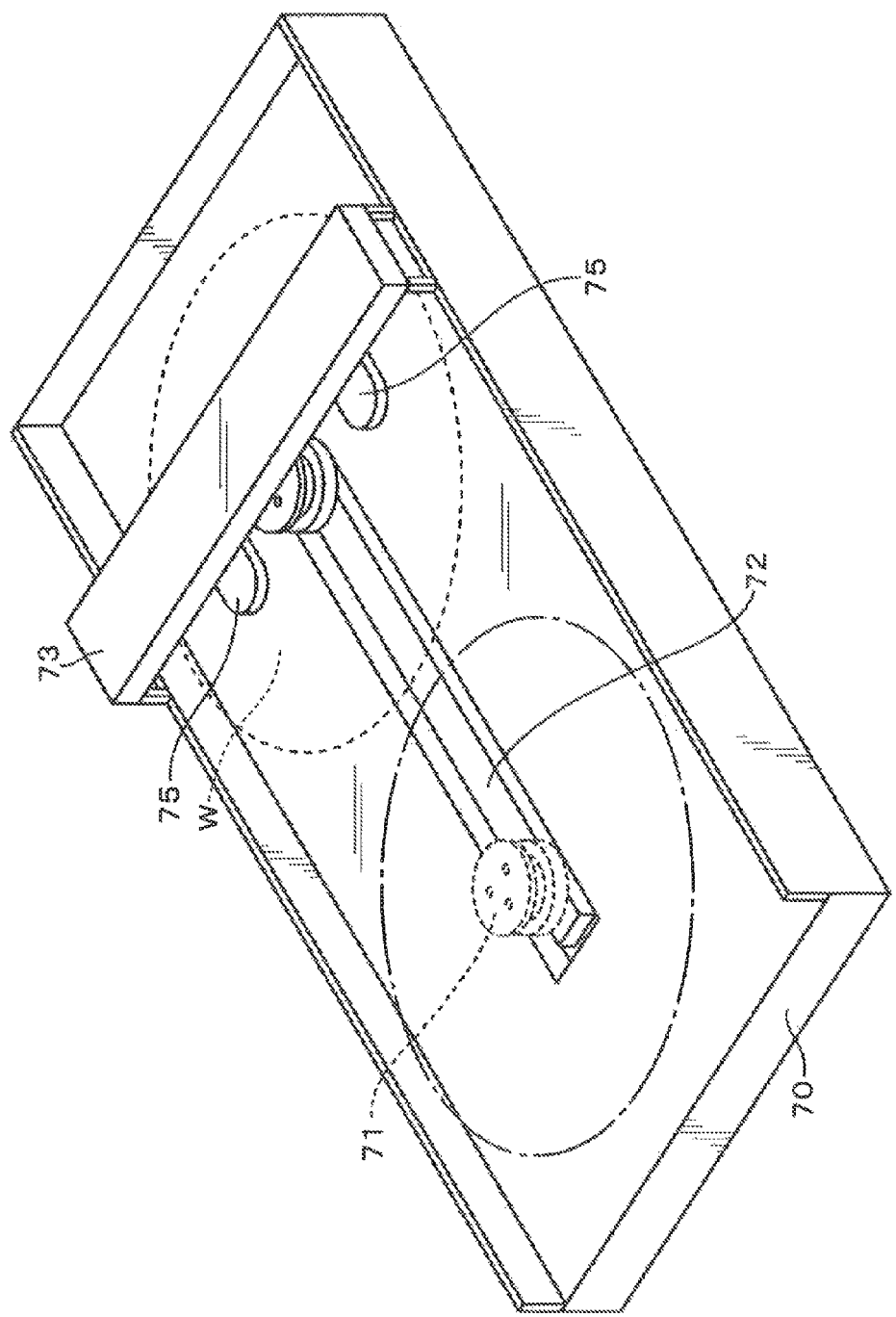
FIG. 14 is a perspective view illustrating an ultraviolet irradiation module.
Figure 15:
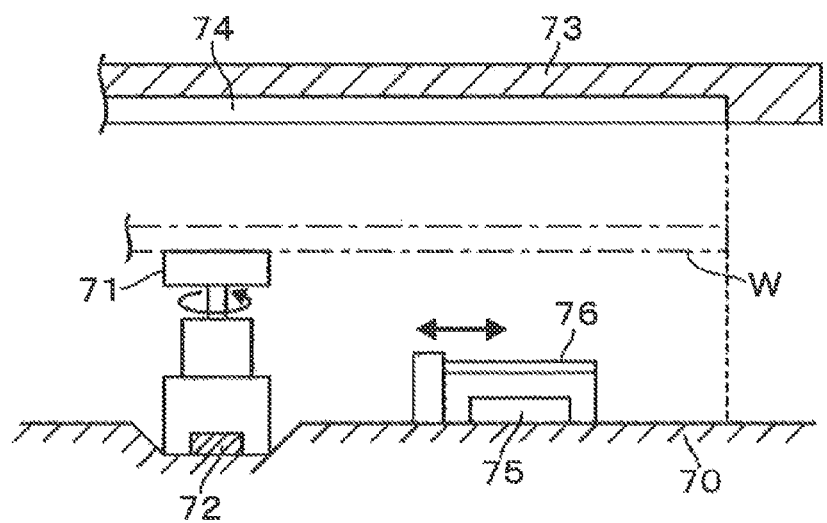
FIG. 15 is a longitudinal side view illustrating the ultraviolet irradiation module.

A concrete example of the UV irradiation module will be described here referring to FIG. 14, FIG. 15. The UV irradiation module has a rotary table 71 provided on a rectangular base 70, which horizontally holds the wafer W and rotates the wafer W around the vertical axis and is movable along a guide rail 72 between a delivery position on the front side of the base 70 and a processing position on the back side. Above the processing position of the wafer W, an ultraviolet irradiation part 73 is provided to extend in the direction of the width of the base 70. The ultraviolet irradiation part 73 is provided with an ultraviolet lamp (hereinafter, referred to as a "UV lamp") 74 that is a light source, which applies an ultraviolet ray in a band shape crossing the wafer W through the center of the wafer W to the wafer W located at the processing position. Below the passage region of the wafer W and directly under the UV lamp 74, irradiation detection parts 75 that detect the illuminance of light from the UV lamp 74 are provided. Each of the irradiation detection parts 75 is provided on each of the right and left of the guide rail 72. Between the passage region of the wafer W and the illuminance detection part 75, a shutter 76 is disposed for receiving or shutting the light from the UV lamp 74 to the illuminance detection part 75.

In the substrate treatment apparatus according to the second embodiment, the wafers W carried in from the carrier C are distributed to the respective unit blocks B11, B12 by the delivery arm 30 in the treatment block S2. The wafer W carried into the unit block B11 (B12) is subjected to the cleaning treatment in the cleaning treatment module and then carried into the UV irradiation module. The wafer W carried into the UV irradiation module is moved to the processing position and then rotated by the rotary table 71 and irradiated with an ultraviolet ray, whereby the entire front surface of the wafer W is irradiated with the ultraviolet ray.

Here, before the wafer W is carried to the processing position in the UV irradiation module, the shutters 76 are opened, and the illuminance of the UV lamp 74 of the UV irradiation module is detected by the illuminance detection parts 75. After the illuminance detection value of the UV irradiation module in one unit block is the set value or less, the wafers W carried in from the carrier C are distributed to the other unit block and subjected to processing, and the wafers W which have already been delivered to the one unit block are subjected to UV irradiation with the irradiation time adjusted to the length corresponding to the illuminance detection value, and then the UV lamp 74 in the UV irradiation module is changed. This can provide the same effect.

Further, a module for forming a water repellent protective film on the front surface of the substrate may be provided in the unit block in the second embodiment and the UV irradiation module may be used as a module for removing the water repellent protective film. In this case, the water repellent protective film is formed with the chemical on the front surface of the substrate, then the front surface of the substrate is cleaned in the cleaning treatment module, and then the protective film is removed in the US irradiation module.

The present invention is applicable to this case, and applicable also to a substrate treatment apparatus that implements processes of applying a chemical containing a precursor of a silicon oxide film being an insulating film to the substrate to form an insulating film and then irradiating the insulating film with UV in the UV irradiation module to improve the quality of the insulating film. In this case, for example, a module for forming a coating film being the insulating film, a heating module for mounting and heating the substrate on a heating plate, and a UV irradiation module are arranged in the unit block.

What is claimed is:

1. A substrate treatment method using a substrate treatment apparatus configured such that substrates in a same lot taken out of a carrier are distributed by a delivery mechanism into a plurality of unit blocks for performing a same series of treatments, each unit block comprising a solution treatment module for supplying a treatment solution to a substrate, an ultraviolet irradiation module for irradiating a substrate with an ultraviolet ray, and a substrate carrying mechanism for carrying a substrate between the modules, the method comprising the steps of:

detecting, by an illuminance detection part, an illuminance of a light source of the ultraviolet irradiation module;

when an illuminance detection value of the ultraviolet irradiation module in one unit block among the plurality of unit blocks becomes a set value or less:

determining an irradiation time adjusted to a length based on the illuminance detection value that was detected by the illuminance detection part and based on an operating life of the light source, controlling the delivery mechanism to stop delivery of a substrate to the one unit block and deliver subsequent substrates to another unit block;

performing irradiation on substrates which have already been delivered to the one unit block with the irradiation time that is adjusted; and changing the light source of the ultraviolet irradiation module in the one unit block after ending the irradiation of the substrates which have already been delivered to the one unit block.

2. The substrate treatment method according to claim 1, further comprising the step of:

monitoring an operating time of the light source of the ultraviolet irradiation module, wherein when the operating time of the light source of the ultraviolet irradiation module in one unit block reaches a set time, the delivery mechanism is controlled to stop delivery of a substrate to the one unit block and deliver subsequent substrates to another unit block, and usual irradiation is performed on substrates which have already been delivered to the one unit block.

3. The substrate treatment method according to claim 1, wherein when the illuminance detection value of the ultraviolet irradiation module in one unit block becomes a set value or less and all of other unit blocks are unusable, taking of a substrate out of a carrier or taking of a substrate out of a subsequent carrier after taking of all of substrates out of a carrier out of which the substrates are being taken is stopped, and the substrates which have been taken out of the carrier are carried into the one unit block and subjected to irradiation with an irradiation time adjusted to a length according to the illuminance detection value.

4. The substrate treatment method according to claim 3, wherein after at least one of the other unit blocks which have been unusable becomes usable after an operation of changing a light source in the ultraviolet irradiation module thereof ends, taking of a substrate out of a carrier is resumed.

5. The substrate treatment method according to claim 1, wherein the solution treatment module is a module that applies a treatment solution to a substrate to form a coating film,
wherein the unit block includes a heating module that performs a heat treatment on a substrate on which the coating film has been formed, and
wherein the ultraviolet irradiation module is an edge exposure module for exposing an edge portion of the substrate which has been subjected to the heat treatment.

6. The substrate treatment method according to claim 1, wherein the solution treatment module is a cleaning treatment module that supplies a cleaning solution to a substrate to perform cleaning, and
wherein the ultraviolet irradiation module is an ultraviolet irradiation module that irradiates a substrate before cleaning or after cleaning with an ultraviolet ray.

7. The substrate treatment method according to claim 1, wherein the illuminance detection part is disposed parallel to a surface of the substrate and directly under the substrate.

8. The substrate treatment method according to claim 1, wherein a shutter is disposed between an ultraviolet passage region of an edge portion of the substrate and the illuminance detection part.

9. The substrate treatment method according to claim 1, further comprising generating, by a control part that includes an alarm generation part, an alarm when the illuminance detection value detected by the illuminance detection part becomes the set value or less.

10. The substrate treatment method according to claim 1, wherein the ultraviolet irradiation module comprised a rotary table that holds the substrate and rotates the substrate around the vertical axis, and
further comprising, when the illuminance detection value detected by the illuminance detection part becomes the set value or less, controlling the rotary table to change a rotation speed of the rotary table to a speed calculated by {reference illuminance×rotation speed in usual case/illuminance detection value}.

11. A substrate treatment method using a substrate treatment apparatus configured such that substrates in a same lot taken out of a carrier are distributed by a delivery mechanism into a plurality of unit blocks for performing a same series of treatments, each unit block comprising a solution treatment module for supplying a treatment solution to a substrate, an ultraviolet irradiation module for irradiating a substrate with an ultraviolet ray, and a substrate carrying mechanism for carrying a substrate between the modules, the method comprising the steps of:
   detecting, by an illuminance detection part, an illuminance of a light source of the ultraviolet irradiation module;
   when an illuminance detection value of the ultraviolet irradiation module in one unit block among the plurality of unit blocks becomes a set value or less:
      determining which of the substrates are subsequent substrates to deliver to another unit block,
      controlling the delivery mechanism to stop delivery of a substrate to the one unit block and deliver the subsequent substrates to another unit block;
      performing irradiation on substrates which have already been delivered to the one unit block with the irradiation time that is adjusted; and
      changing the light source of the ultraviolet irradiation module in the one unit block after ending the irradiation of the substrates which have already been delivered to the one unit block.

12. The substrate treatment method according to claim 11, further comprising the step of:
   monitoring an operating time of the light source of the ultraviolet irradiation module,
   when the operating time of the light source of the ultraviolet irradiation module in one unit block reaches a set time, controlling the delivery mechanism to stop delivery of a substrate to the one unit block and deliver subsequent substrates to another unit block, and usual irradiation is performed on substrates which have already been delivered to the one unit block.

13. The substrate treatment method according to claim 11, wherein when the illuminance detection value of the ultraviolet irradiation module in one unit block becomes a set value or less and all of other unit blocks are unusable, taking of a substrate out of a carrier or taking of a substrate out of a subsequent carrier after taking of all of substrates out of a carrier out of which the substrates are being taken is stopped, and the substrates which have been taken out of the carrier are carried into the one unit block and subjected to irradiation with an irradiation time adjusted to a length according to the illuminance detection value.

14. The substrate treatment method according to claim 13, wherein after at least one of the other unit blocks which have been unusable becomes usable after an operation of changing a light source in the ultraviolet irradiation module thereof ends, taking of a substrate out of a carrier is resumed.

15. The substrate treatment method according to claim 11, wherein the solution treatment module is a module that applies a treatment solution to a substrate to form a coating film,
wherein the unit block includes a heating module that performs a heat treatment on a substrate on which the coating film has been formed, and
wherein the ultraviolet irradiation module is an edge exposure module for exposing an edge portion of the substrate which has been subjected to the heat treatment.

16. The substrate treatment method according to claim 11, wherein the solution treatment module is a cleaning treatment module that supplies a cleaning solution to a substrate to perform cleaning, and
wherein the ultraviolet irradiation module is an ultraviolet irradiation module that irradiates a substrate before cleaning or after cleaning with an ultraviolet ray.

17. The substrate treatment method according to claim 11, wherein the illuminance detection part is disposed parallel to a surface of the substrate and directly under the substrate.

18. The substrate treatment method according to claim 11, wherein a shutter is disposed between an ultraviolet passage region of an edge portion of the substrate and the illuminance detection part.

19. The substrate treatment method according to claim 11, further comprising generating, by a control part that includes an alarm generation part, an alarm when the illuminance detection value detected by the illuminance detection part becomes the set value or less.

20. The substrate treatment method according to claim 11, wherein the ultraviolet irradiation module comprises a
rotary table that holds the substrate and rotates the substrate around the vertical axis, and
further comprising, when the illuminance detection value detected by the illuminance detection part becomes the set value or less, controlling the rotary table to change a rotation speed of the rotary table to a speed calculated by {reference illuminance×rotation speed in usual case/illuminance detection value}.

* * * * *